(12) United States Patent
Bangsaruntip et al.

(10) Patent No.: US 8,097,515 B2
(45) Date of Patent: Jan. 17, 2012

(54) SELF-ALIGNED CONTACTS FOR NANOWIRE FIELD EFFECT TRANSISTORS

(75) Inventors: Sarunya Bangsaruntip, Yorktown Heights, NY (US); Guy M. Cohen, Yorktown Heights, NY (US); Shreesh Narasimha, Yorktown Heights, NY (US); Jeffrey W. Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 12/631,213

(22) Filed: Dec. 4, 2009

(65) Prior Publication Data

US 2011/0133165 A1 Jun. 9, 2011

(51) Int. Cl.
*H01L 21/336* (2006.01)
*H01L 29/76* (2006.01)

(52) U.S. Cl. ........ 438/282; 438/157; 438/198; 438/281; 438/283; 438/458; 257/24; 257/347; 257/348; 257/E21.415; 257/E21.444; 257/E29.275; 257/E29.286

(58) Field of Classification Search ............... 438/157, 438/198, 281, 282, 283, 458; 257/24, 347, 257/348, E21.415, E21, 444, E29.275, E29.286
See application file for complete search history.

(56) References Cited

U.S. PATENT DOCUMENTS

| | | | |
|---|---|---|---|
| 4,995,001 A | 2/1991 | Dawson et al. | |
| 5,308,445 A | 5/1994 | Takasu | |
| 5,438,018 A | 8/1995 | Mori et al. | |
| 5,552,622 A | 9/1996 | Kimura | |
| 5,574,308 A | 11/1996 | Mori et al. | |
| 5,668,046 A | 9/1997 | Koh et al. | |
| 6,365,465 B1 * | 4/2002 | Chan et al. | 438/283 |
| 6,642,115 B1 * | 11/2003 | Cohen et al. | 438/283 |
| 6,653,209 B1 | 11/2003 | Yamagata | |
| 6,806,141 B2 | 10/2004 | Kamins | |
| 6,855,606 B2 | 2/2005 | Chen et al. | |

(Continued)

FOREIGN PATENT DOCUMENTS

EP 217811 A1 4/2010

(Continued)

OTHER PUBLICATIONS

Alexander J. Gates, "Designing a Nanoelectronic Circuit to Control a Millimeter-scale Walking Robot," Mitre Technical Paper, Aug. 2004, http://www.mitre.org/work/tech_papers/tech_papers_04/04_1248/04_1248.pdf.

(Continued)

*Primary Examiner* — Dao H Nguyen
(74) *Attorney, Agent, or Firm* — Cantor Colburn LLP; Vazken Alexanian

(57) ABSTRACT

A method for forming a nanowire field effect transistor (FET) device includes forming a nanowire over a semiconductor substrate, forming a gate structure around a portion of the nanowire, forming a capping layer on the gate structure; forming a first spacer adjacent to sidewalls of the gate and around portions of nanowire extending from the gate, forming a hardmask layer on the capping layer and the first spacer, removing exposed portions of the nanowire, epitaxially growing a doped semiconductor material on exposed cross sections of the nanowire to form a source region and a drain region, forming a silicide material in the epitaxially grown doped semiconductor material, and forming a conductive material on the source and drain regions.

16 Claims, 9 Drawing Sheets

U.S. PATENT DOCUMENTS

| | | | |
|---|---|---|---|
| 6,882,051 B2 | 4/2005 | Majumdar et al. | |
| 6,891,227 B2 | 5/2005 | Appenzeller et al. | |
| 6,903,013 B2 | 6/2005 | Chan et al. | |
| 6,996,147 B2 | 2/2006 | Majumdar et al. | |
| 7,101,762 B2 * | 9/2006 | Cohen et al. | 438/283 |
| 7,151,209 B2 | 12/2006 | Empedocles et al. | |
| 7,180,107 B2 | 2/2007 | Appenzeller et al. | |
| 7,253,060 B2 | 8/2007 | Yun et al. | |
| 7,297,615 B2 | 11/2007 | Cho et al. | |
| 7,311,776 B2 | 12/2007 | Lin et al. | |
| 7,443,025 B2 | 10/2008 | Verbist | |
| 7,446,025 B2 | 11/2008 | Cohen et al. | |
| 7,452,778 B2 | 11/2008 | Chen et al. | |
| 7,456,068 B2 | 11/2008 | Kavalieros et al. | |
| 7,456,476 B2 | 11/2008 | Hareland et al. | |
| 7,498,211 B2 | 3/2009 | Ban et al. | |
| 7,550,333 B2 | 6/2009 | Shah et al. | |
| 7,569,941 B2 | 8/2009 | Majumdar et al. | |
| 7,791,144 B2 | 9/2010 | Chidambarrao et al. | |
| 7,799,657 B2 * | 9/2010 | Dao | 438/458 |
| 7,834,345 B2 | 11/2010 | Bhuwalka et al. | |
| 2004/0149978 A1 | 8/2004 | Snider | |
| 2004/0166642 A1 | 8/2004 | Chen et al. | |
| 2005/0121706 A1 | 6/2005 | Chen et al. | |
| 2005/0266645 A1 * | 12/2005 | Park | 438/282 |
| 2005/0275010 A1 | 12/2005 | Chen et al. | |
| 2006/0033145 A1 | 2/2006 | Kakoschke et al. | |
| 2007/0001219 A1 | 1/2007 | Radosavljevic et al. | |
| 2007/0267619 A1 | 11/2007 | Nirschl | |
| 2007/0267703 A1 | 11/2007 | Chong et al. | |
| 2007/0284613 A1 | 12/2007 | Chui et al. | |
| 2008/0014689 A1 | 1/2008 | Cleavelin et al. | |
| 2008/0061284 A1 | 3/2008 | Chu et al. | |
| 2008/0067495 A1 | 3/2008 | Verhulst | |
| 2008/0067607 A1 | 3/2008 | Verhulst et al. | |
| 2008/0079041 A1 | 4/2008 | Suk et al. | |
| 2008/0121932 A1 | 5/2008 | Ranade | |
| 2008/0135949 A1 | 6/2008 | Lo et al. | |
| 2008/0142853 A1 | 6/2008 | Orlowski | |
| 2008/0149914 A1 | 6/2008 | Samuelson et al. | |
| 2008/0149997 A1 | 6/2008 | Jin et al. | |
| 2008/0150025 A1 | 6/2008 | Jain | |
| 2008/0179752 A1 | 7/2008 | Yamauchi et al. | |
| 2008/0191196 A1 | 8/2008 | Lu et al. | |
| 2008/0224224 A1 | 9/2008 | Vandenderghe et al. | |
| 2008/0227259 A1 | 9/2008 | Avouris et al. | |
| 2008/0246021 A1 | 10/2008 | Suk et al. | |
| 2008/0247226 A1 | 10/2008 | Liu et al. | |
| 2008/0290418 A1 | 11/2008 | Kalburge | |
| 2009/0026553 A1 | 1/2009 | Bhuwalka et al. | |
| 2009/0057650 A1 | 3/2009 | Lieber et al. | |
| 2009/0057762 A1 | 3/2009 | Bangsaruntip et al. | |
| 2009/0061568 A1 | 3/2009 | Bangsaruntip et al. | |
| 2009/0090934 A1 | 4/2009 | Tezuka et al. | |
| 2009/0134467 A1 | 5/2009 | Ishida et al. | |
| 2009/0149012 A1 | 6/2009 | Brask et al. | |
| 2009/0181477 A1 | 7/2009 | King et al. | |

FOREIGN PATENT DOCUMENTS

| | | |
|---|---|---|
| KR | 20090044799 A | 5/2009 |
| WO | 02084757 A1 | 10/2002 |
| WO | WO2008069765 A1 | 6/2008 |

OTHER PUBLICATIONS

Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.

M. M. Ziegler et al., "The CMOS/NANO Interface from a Circuits Perspective," ISCAS '03. Proceedings of the 2003 International Symposium on Circuits and Systems, 2003, May 25-28, 2003, vol. 4, pp. IV-904-IV-907.

G.W. Neudeck, "An Overview of Double-Gate MOSFETs," Proceedings of 15th Biennial University/Government/Industry Microelectronics Symposium. UGIM 2003. New York, NY: IEEE, US, Jun. 30-Jul. 2, 2003., pp. 214-217.

International Search Report; International Application No. PCT/EP2010/066961; International Filing Date: Nov. 8, 2010; Date of Mailing: Feb. 10, 2011.

International Search Report; International Application No. PCT/EP2010/066483; International Filing Date: Oct. 29, 2010; Date of Mailing: Feb. 7, 2011.

International Search Report—Written Opinion; International Application No. PCT/EP2010/066483; International Filing Date: Oct. 29, 2010; Date of Mailing: Feb. 7, 2011.

International Search Report—Written Opinion; International Application No. PCT/EP2010/066961; International Filing Date: Nov. 8, 2010; Date of Mailing: Feb. 10, 2011.

Pavanello et al., "Evaluation of Triple-Gate FinFETs With SiO2-HfO2-TiN Gate Stack Under Analog Operation," Solid State Electronics, Elsevier Science Publishers, Barking, GB, vol. 51, No. 2, Mar. 7, 2007, pp. 285-291.

Alexander J. Gates, "Designing a Nanoelectronic Circuit to Control a Millimeter-scale Walking Robot," Mitre Technical Paper, Nov. 2004, http://www.mitre.org/work/tech_papers/tech_papers_04/04_1248/04_1248.pdf.

Andriotis et al., 'Realistic nanotube-metal contact configuration for molecular electronics applications, IEEE Sensors Journal, vol. 8, No. 6, Jun. 2008.

R, Bahar, 'Trends and Future Directions in Nano Structure Based Computing and Fabrication', ICCD 2006, International Conf. on Computer Design, Oct. 1-4, 2007, pp. 522-527.

Buddharaju et al., 'Gate-All-Around Si-Nanowire CMOS Inverter Logic Fabricated Using Top-Down Approach', European Solid-State Device Research Conference, Sep. 11-11, 2007, pp. 303-306.

Chen et al., 'Demonstration of Tunneling FETs Based on Highly Scalable Verticle Silicon Nanowires', IEEE Electron Device Letters, vol. 30, No. 7, Jul. 2009, pp. 754-756.

Hu et al., 'Fringing field effects on electrical resistivity of semiconductor nanowire-metal contacts', Applied Physics Letters 92, 083503_2008.

Jie Xiang et al., "Ge/Si Nanowire Heterostructures as High-Performance Field-Effect Transistors," Nature 441, 489-493 (May 25, 2006).

Knoch et al., 'Tunneling phenomena in carbon nanotube field-effect transistors', Phys Stat Sol. (a) 205, No. 4, 679-694 (2008).

Leonard et ai., 'Size-dependent effects on electrical contacts to nanotubes and nanowires', Phys Rev Lett., Jul. 14, 2006; 97(2):026804.

M. T. Bjork et al., "Silicon Nanowire Tunneling Field-Effect Transistors," Applied Physics Letters 92, 193504 (2008).

Ma et al., 'High-performance nanowire complementary metal-semiconductor inverters', Applied Physics Letters 93, 053105_2008.

Saumitra Raj mehrotra, 'A Simulation Study of Silicom Nanowire Field Effect Transistors (FETs), University of Cincinnati, Jul. 2007.

Lauhon et al., 'Epitaxial core-shell and core-multishell nanowire heterostructures', Nature, vol. 420, Nov. 7, 2002, pp. 57-61.

Singh et al., 'Si, SiGe Nanowire Devices by Top-Down Technology and Their Applications', IEEE Transactions on Electron Devices, vol. 55, No. 11, Nov. 2008, pp. 3107-3118.

Taichi Su et al., New Planar Self-Aligned Double-Gate Fully Depleted P-MOSFET's Using Epitaxial Lateral Overgrowth (ELO) and Selectively Grown Source/Drain (S/D), (Oct. 2000).

N. Checka, 'Circuit Architecture for 3D Integration', Chapter 13 in Wafer Level 3-D ICs Process Technology, ed. C.S. Tan, Springer US, 2008, ISBN 978-0-387-76534-1.

International Search Report; International Application No. PCT/EP2011/053174; International Filing Date: Mar. 3, 2011; Date of Mailing: May 31, 2011.

International Search Report—Written Opinion; International Application No. PCT/EP2011/053174; International Filing Date: Mar. 3, 2011; Date of Mailing: May 31, 2011.

International Search Report; International Application No. PCT/US2011/029304; International Filing Date: Mar. 22, 2011; Date of Mailing: May 20, 2011.

International Search Report—Written Opinion; International Application No. PCT/US2011/029304; International Filing Date: Mar. 22, 2011; Date of Mailing: May 20, 2011.

* cited by examiner

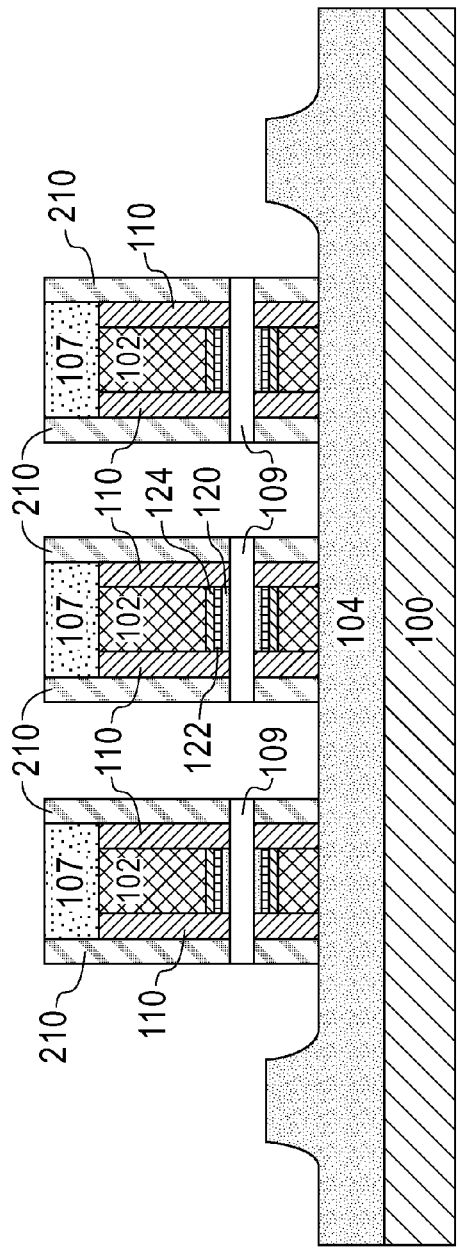
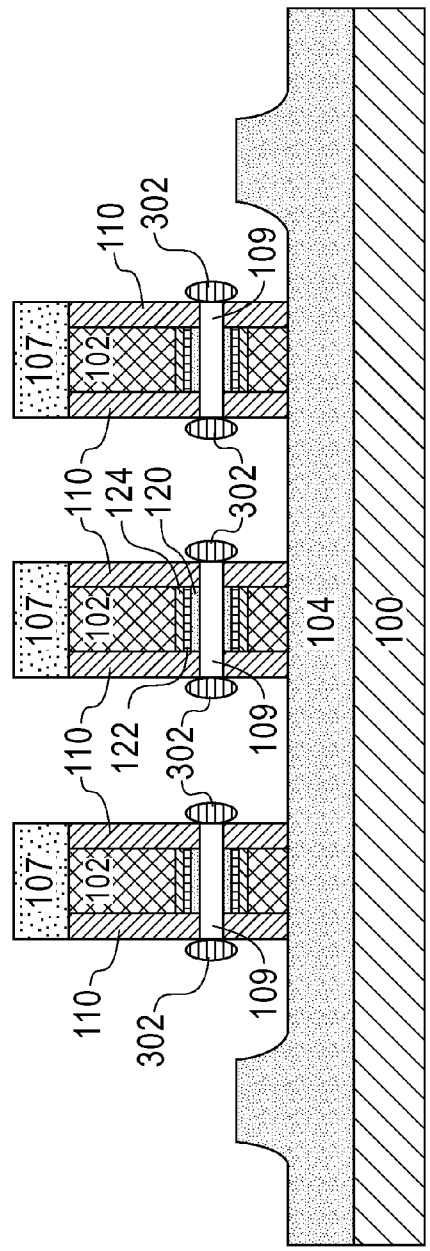

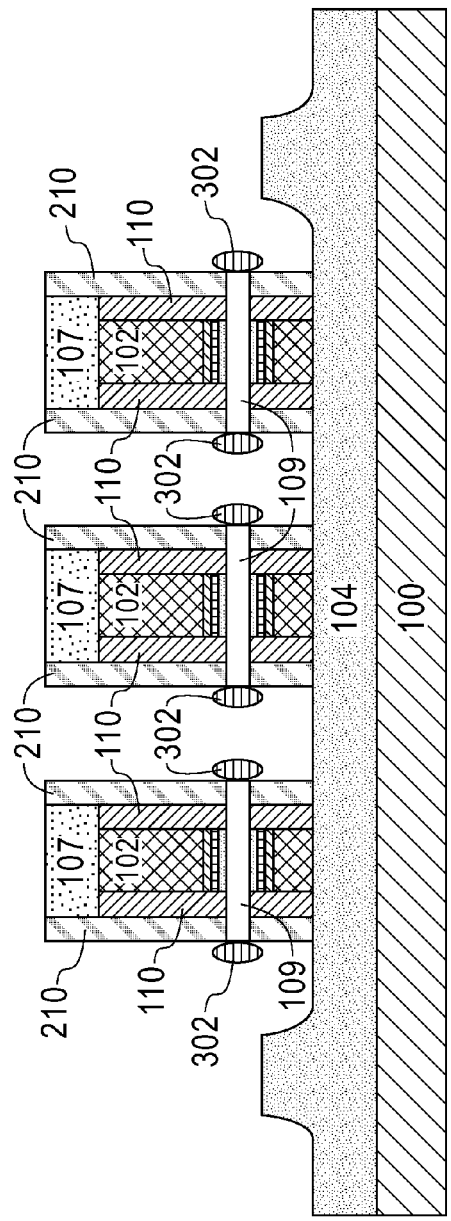
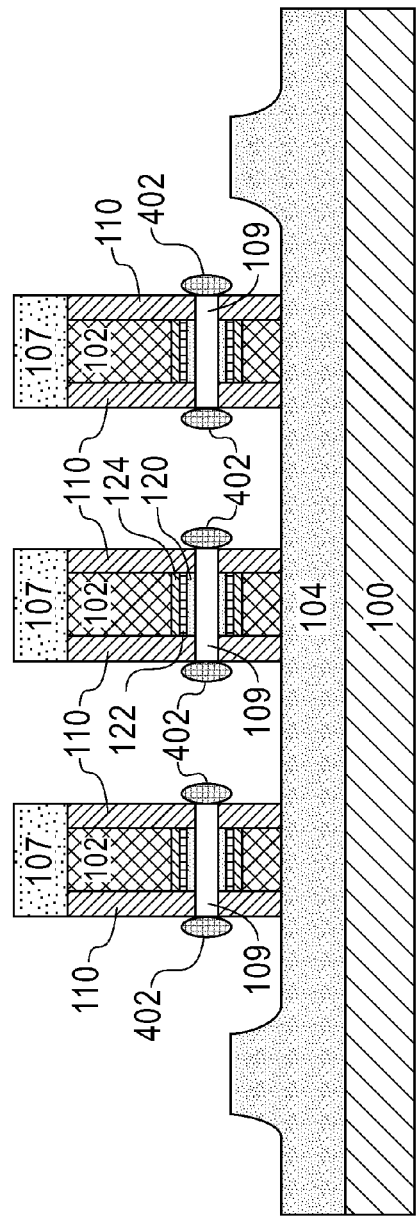
FIG. 3B
FIG. 4A

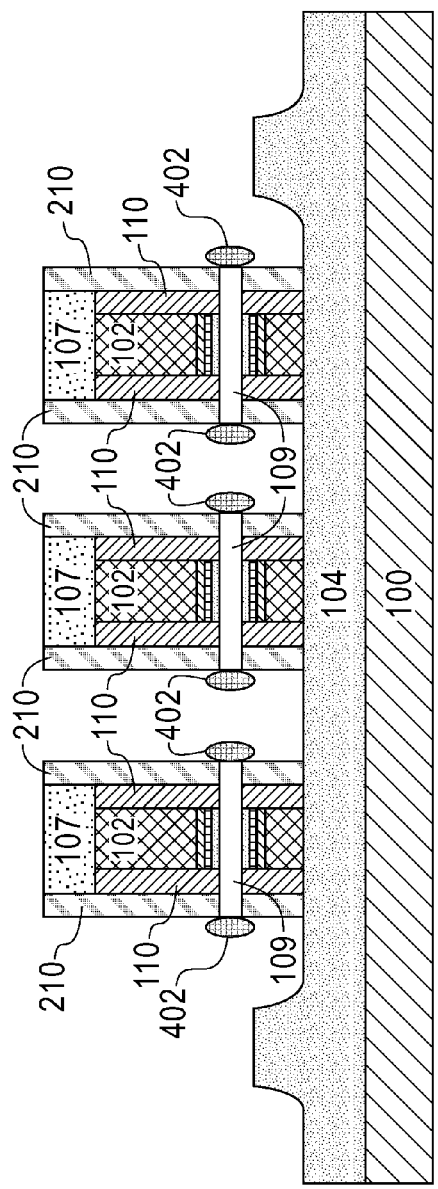
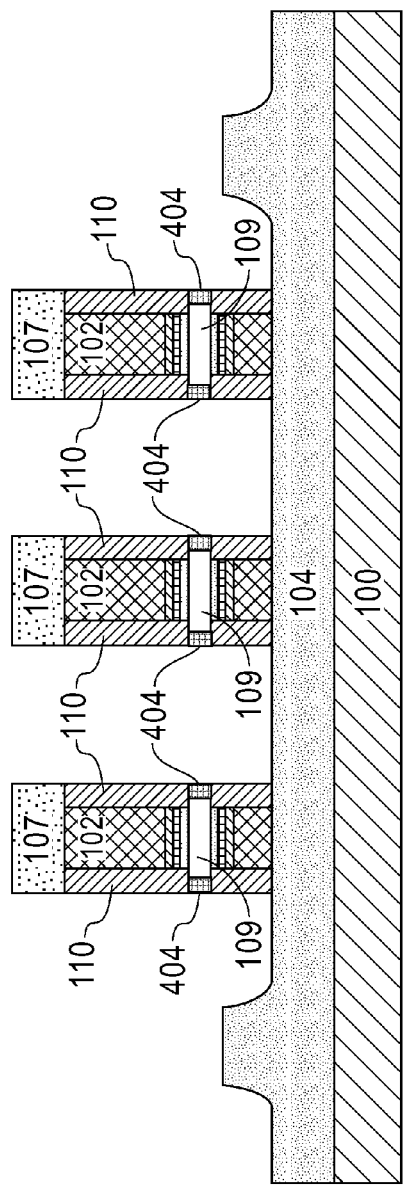
FIG. 4B
FIG. 4C

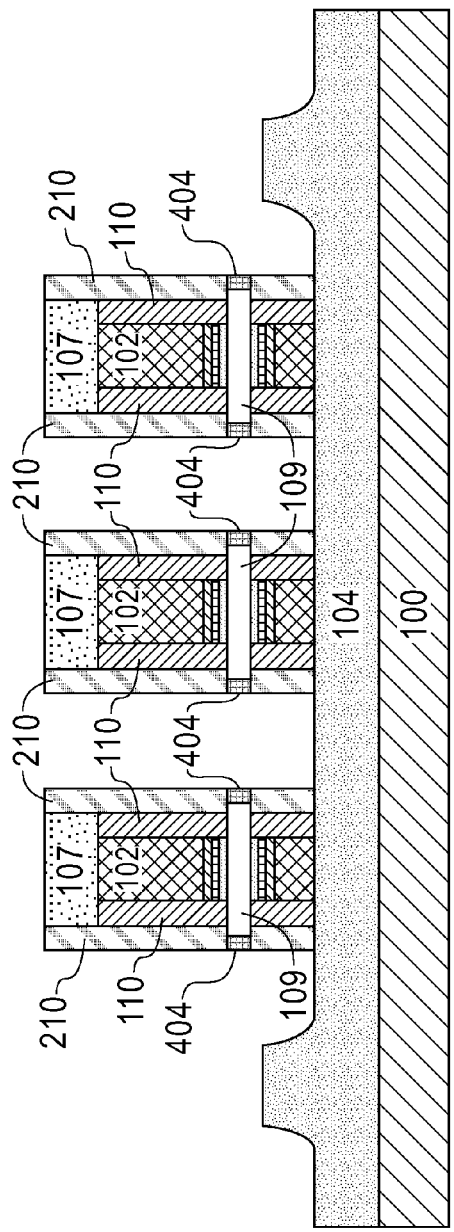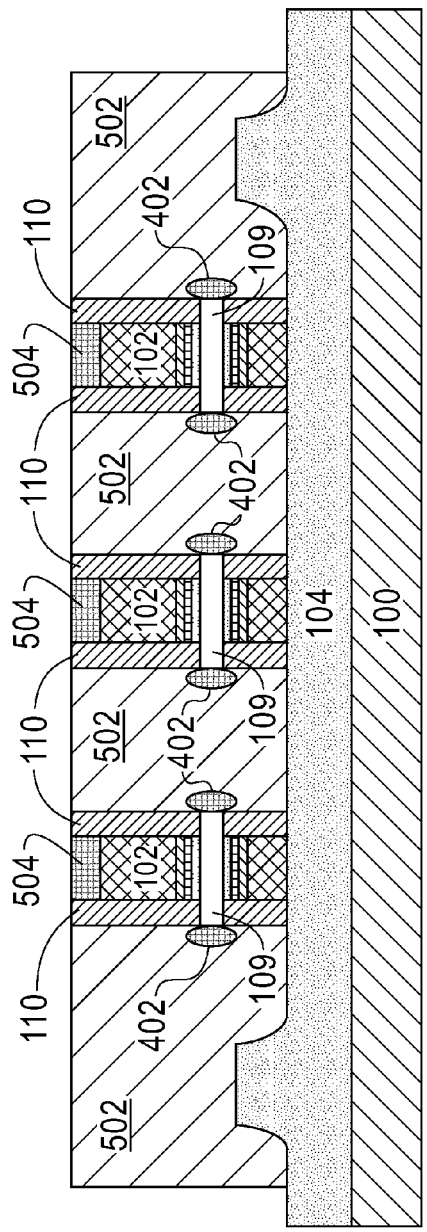

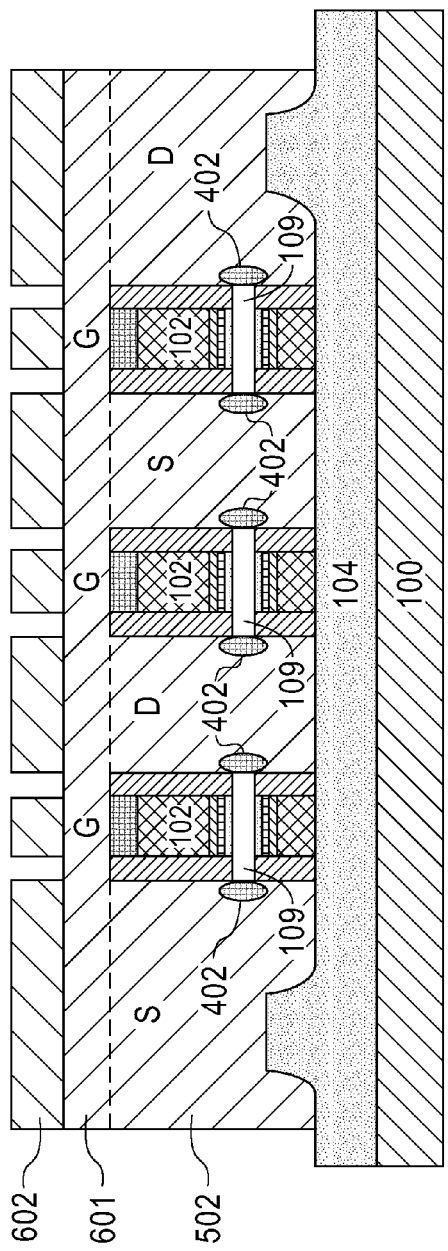
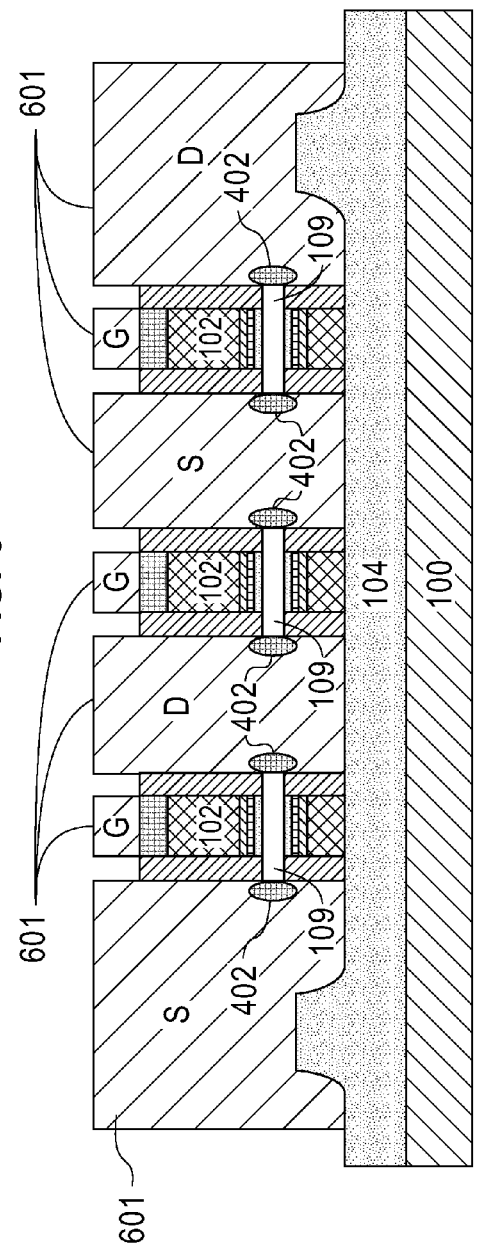
FIG. 6
FIG. 7A

SELF-ALIGNED CONTACTS FOR NANOWIRE FIELD EFFECT TRANSISTORS

CROSS REFERENCE TO RELATED APPLICATIONS

This application is related to co-pending application Ser. Nos. 12/631,199, 12/631,205, 12/630,942, 12/630,939, 12/631,342, all of which are incorporated by reference herein.

FIELD OF INVENTION

The present invention relates to semiconductor nanowire field effect transistors.

DESCRIPTION OF RELATED ART

A nanowire field effect transistor (FET) includes doped portions of nanowire that contact the channel region and serve as source and drain regions of the device. Previous fabrication methods that used ion-implantation to dope the small diameter nanowire may result in undesirable amorphization of the nanowire or an undesirable junction doping profile.

BRIEF SUMMARY

In one aspect of the present invention, a method for forming a nanowire field effect transistor (FET) device includes forming a nanowire over a semiconductor substrate, forming a gate structure around a portion of the nanowire, forming a capping layer on the gate structure; forming a first spacer adjacent to sidewalls of the gate and around portions of nanowire extending from the gate, forming a hardmask layer on the capping layer and the first spacer, removing exposed portions of the nanowire, epitaxially growing a doped semiconductor material on exposed cross sections of the nanowire to form a source region and a drain region, forming a silicide material in the epitaxially grown doped semiconductor material, forming a conductive material on the source and drain regions, and forming an isolation region around the device.

In another aspect of the present invention, a method for forming a nanowire field effect transistor (FET) device includes forming a nanowire over a semiconductor substrate, forming a gate structure around a portion of the nanowire, forming a capping layer on the gate structure, forming a first spacer adjacent to sidewalls of the gate and around portions of nanowire extending from the gate, forming a hardmask layer on the capping layer and the first spacer, removing exposed portions of the nanowire, doping the exposed portions of the nanowire to form source and drain regions, forming a silicide material in the source and drain regions of the exposed portions of the nanowire, forming a conductive material on the source and drain regions, and forming an isolation region around the device.

In yet another aspect of the present invention, a nanowire field effect transistor (FET) device includes a channel region including a silicon portion having a first distal end extending from the channel region and a second distal end extending from the channel region, the silicon portion is partially surrounded by a gate structure disposed circumferentially around the silicon portion, a polysilicon capping layer having a silicide portion disposed on the gate structure, a source region having a silicide portion, the source region including a first doped epi-silicon nanowire extension contacting the first distal end of the silicon portion, a drain region having a silicide portion, the drain region including a second doped epi-silicon nanowire extension contacting the second distal end of the silicon portion, a first conductive member contacting the silicide portion of the polysilicon capping layer, a second conductive member contacting the silicide portion of the source region, and a third conductive member contacting the silicide portion of the drain region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-7D are cross-sectional views illustrating exemplary methods for forming contacts for field effect transistor (FET) devices.

DETAILED DESCRIPTION

Figure 1:
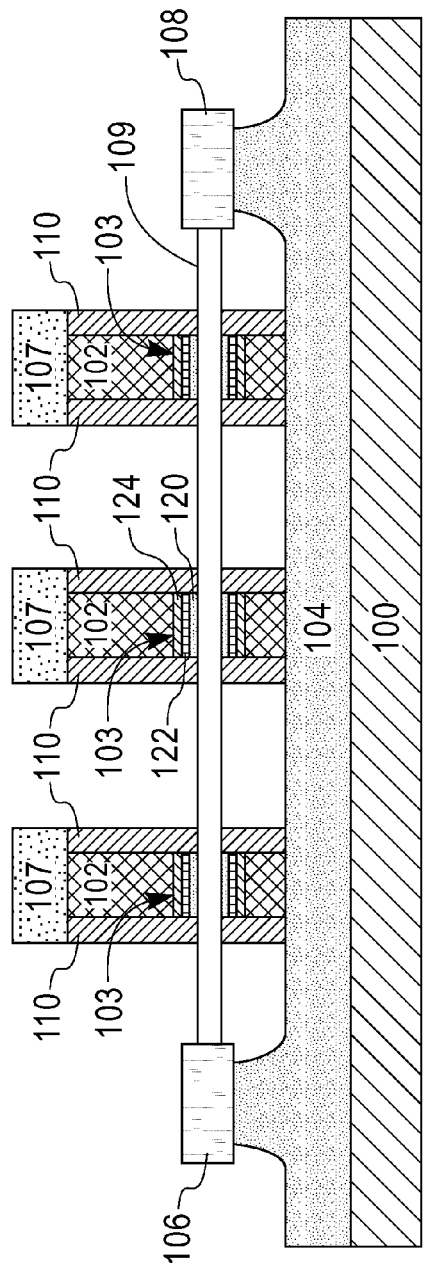

FIG. 1 illustrates a cross-sectional view of a plurality of FET devices. A silicon on insulator (SOI) pad region 106, pad region 108, and nanowire portion 109 are defined on a buried oxide (BOX) layer 104 that is disposed on a silicon substrate 100. The pad region 106, pad region 108, and nanowire portion 109 may be patterned by the use of lithography followed by an etching process such as, for example, reactive ion etching (RIE). Once the pad region 106, pad region 108, and nanowire portion 109 are patterned, an isotropic etching process suspends the nanowires 109 above the BOX layer 104. Following the isotropic etching, the nanowire portions 109 may be smoothed to form elliptical shaped (and in some cases, cylindrical shaped) nanowires 109 that are suspended above the BOX layer 104 by the pad region 106 and the pad region 108. An oxidation process may be performed to reduce the diameter of the nanowires 109 to desired dimensions.

Once the nanowires 109 are formed, gates 103 are formed around the nanowires 109, as described in further detail below, and capped with a polysilicon layer 102. A hardmask layer 107, such as, for example silicon nitride ($Si_3N_4$) is deposited over the polysilicon layer 102. The polysilicon layer 102 and the hardmask layer 107 may be formed by depositing polysilicon material over the BOX layer 104 and the SOI portions, depositing the hardmask material over the polysilicon material, and etching by reactive ion etching (RIE) to form the polysilicon layer (capping layer) 102 and the hardmask layer 107 illustrated in FIG. 1. The etching of the gates 103 may be performed by directional etching that results in straight sidewalls of the gates 103. Following the directional etching, polysilicon 102 remains under the nanowires 109 and in regions not masked by the hardmask 107. Isotropic etching may be performed to remove polysilicon 102 from under the nanowires 109.

The fabrication of the arrangement shown in FIG. 1 may be performed using similar methods as described above for the fabrication of a single row of gates. The methods described herein may be used to form any number of devices on a nanowire between pad regions 106 and 108.

The gate 103 is formed by depositing a first gate dielectric layer 120, such as silicon dioxide ($SiO_2$) around the nanowire 109. A second gate dielectric layer 122 such as, for example, hafnium oxide ($HfO_2$) is formed around the first gate dielectric layer 120. A metal layer 124 such as, for example, tantalum nitride (TaN) is formed around the second gate dielectric layer 122. The metal layer 124 is surrounded by polysilicon layer 102. Doping the polysilicon layer 102 with impurities such as boron (p-type), or phosphorus (n-type) makes the polysilicon layer 102 conductive.

A first set of spacers 110 are formed along opposing sides of the polysilicon layer 102. The spacers 110 are formed by depositing a blanket dielectric film such as silicon nitride and etching the dielectric film from all horizontal surfaces by RIE. The spacers 110 are formed around portions of the nanowire 109 that extend from the polysilicon layer 102 and surround portions of the nanowires 109.

Figure 2A:
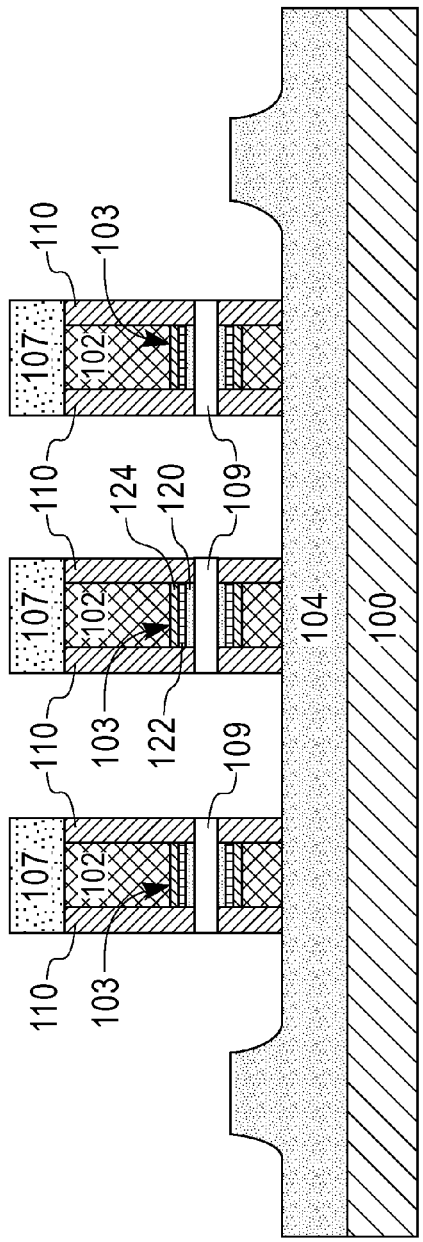

FIG. 2A illustrates the resultant structure after a selective RIE process is performed to remove exposed portions of the nanowires 109 and the pad regions 106 and 108 (shown in FIG. 1). An example of a selective RIE process includes an RIE based on HBr chemistry that etches silicon while being selective to reduce the etching of dielectrics such as silicon oxide and silicon nitride. The portions of the nanowire 108 that are surrounded by the spacers 110 are not etched, and have exposed cross sections defined by the spacers 110.

FIG. 2B illustrates a second set of spacers 210 that may be formed adjacent to the first set of spacers 110. The second set of spacers may include, for example, a nitride or an oxide material. Once the spacers 210 are formed, a selective RIE process is performed similar to the RIE process described above in FIG. 2A.

FIGS. 3A and 3B illustrates cross-sectional views of the resultant structures following a selective epi-silicon growth that may be performed to form nanowire extensions 302. The nanowire extensions 302 are epitaxially grown from the exposed cross-sectional portions of the nanowire 109 that are surrounded by the spacer walls 110 (in FIG. 3A) and 210 (in FIG. 3B). The nanowire extensions 302 are formed by epitaxially growing, for example, in-situ doped silicon (Si) or a silicon germanium (SiGe) that may be either n-type or p-type doped. The in-situ doped epi process forms the source region and the drain region of the nanowire FET. As an example, a chemical vapor deposition (CVD) reactor may be used to perform the epitaxial growth. Precursors for silicon epitaxy include $SiCl_4$, $SiH_4$ combined with HCl. The use of chlorine allows selective deposition of silicon only on exposed silicon surfaces. A precursor for SiGe may be $GeH_4$, which may obtain deposition selectivity without HCl. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

FIGS. 4A and 4B illustrate an exemplary resultant structure following silicidation where a silicide 402 is formed on the nanowire extensions 302 (of FIGS. 3A and 3B). Examples of silicide forming metals include Ni, Pt, Co, and alloys such as NiPt. When Ni is used the NiSi phase is formed due to its low resistivity. For example, formation temperatures include 400-600° C.

FIGS. 4C and 4D illustrate alternate examples of resultant structures that do not include the nanowire extensions 302. In FIGS. 4C and 4D, the exposed cross-sectional portions of the nanowire 109 may be doped with ions to form source and drain regions by, for example, a low energy plasma doping or low energy ion implantation followed by an annealing process. A silicide 404 is formed on the exposed cross-sectional portions of the nanowire 109 that are surrounded by the spacer walls 110 (in FIG. 3A) and 210 (in FIG. 3B).

FIG. 5 illustrates an example of the resultant structure following the removal of the hardmask 107 and the deposition of contact material 502 such as, for example, W, Cu, Ag, or Al on the BOX layer 104. A silicide 504 is formed on the polysilicon 102. The resultant structure may be formed by, for example, depositing a layer of the contact material 502 on the BOX layer 104 and the hardmasks 107. A portion of the contact material 502 and the hardmasks 107 may be removed by, for example, a chemical mechanical polishing (CMP) process. Once the polysilicon 102 is exposed by the CMP process, the silicide 504 may be formed on the polysilicon 102. Alternatively, the hardmasks 107 may be removed by, for example, a CMP or etching process, and the silicide 504 may be formed on the exposed polysilicon 102. A layer of the contact material 502 may be formed on the BOX layer 104, the spacers 110, and the silicide 504. Once the layer of contact material 502 is formed, a CMP process may be performed so as to result in the illustrated structure.

FIG. 6 illustrates a second layer of contact material 601 that is formed on the contact material 502, and a mask layer 602 that may be disposed by a lithographic process on the contact material 601. The mask layer 602 defines the contacts for the source (S), drain (D), and gate (G) regions of the devices.

FIG. 7A illustrates the resultant FET structure following etching portions of the contact material 601, and the removal of the mask layer 602 (of FIG. 6).

Figure 7B:
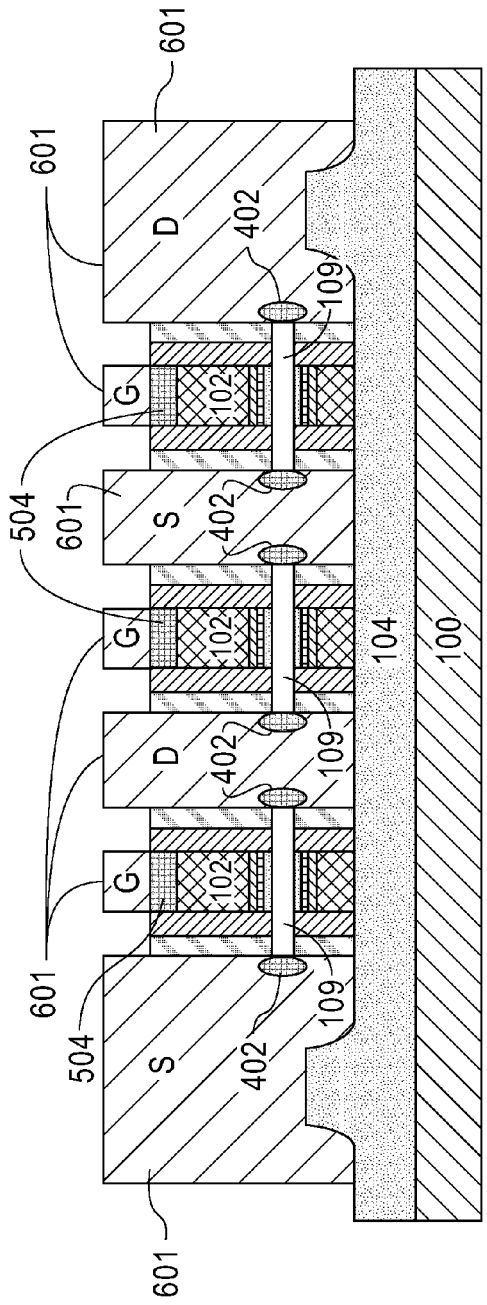
Figure 7C:
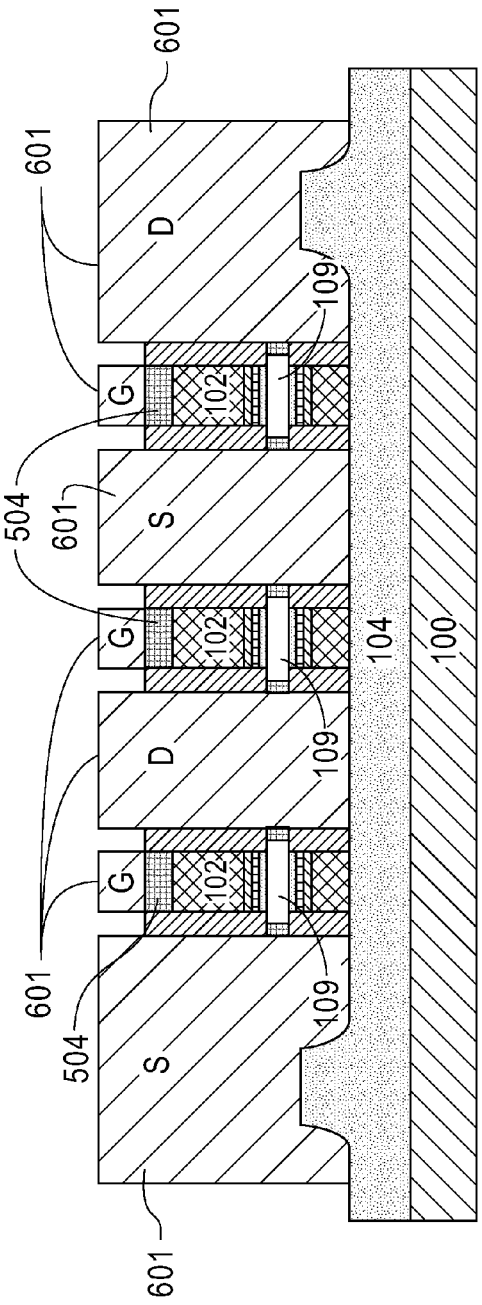
Figure 7D:
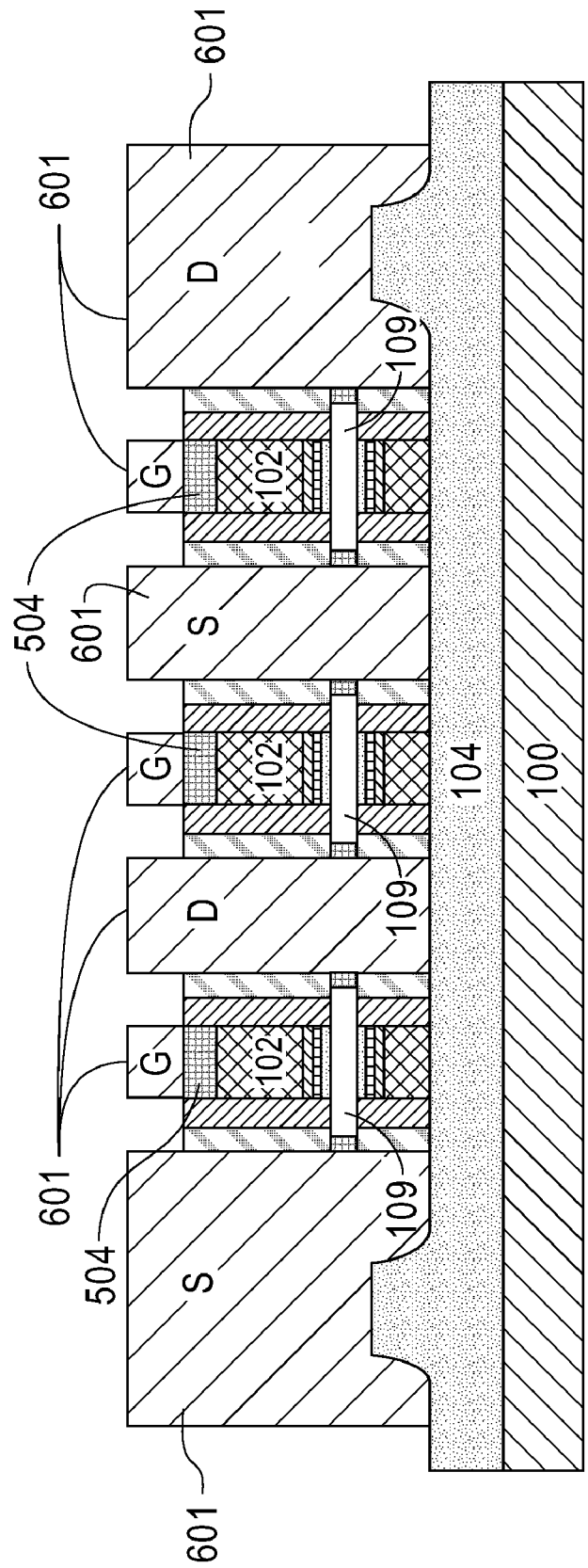

FIGS. 7B-7D illustrate the resultant FET structures of the embodiments described in FIGS. 4B-4D respectively above following the formation of silicide 504 in the polysilicon 102 and deposition and etching to form resultant structure of the contact material 601 using similar methods as described above in FIGS. 5-6.

Figure 8:
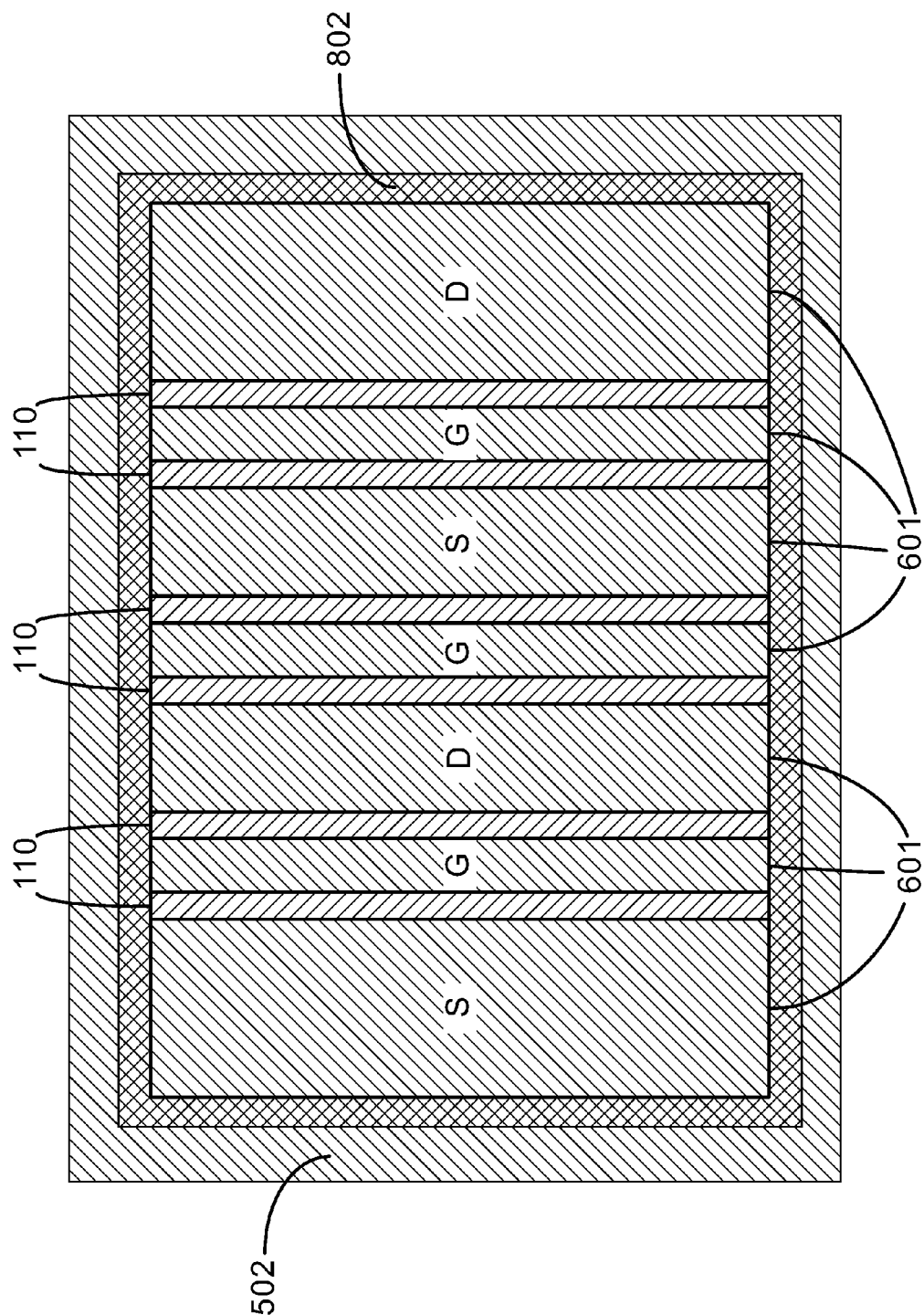
FIG. 8 is a top-down view of the devices of FIG. 7A.

FIG. 8 illustrates a top view of the resultant structure of the illustrated embodiment of FIG. 7A following the isolation of the devices with a material 802 such as, for example, an oxide or nitride dielectric material. Following the formation of the contact material 601, a mask layer is patterned on the devices to define a trench area around the devices. An etching process is used to remove contact material 601 and 502 from the trench area. The trench area is filled with the material 802 as illustrated in FIG. 8 to form an isolation region. A similar method may be performed to form the material 802 around the devices in the illustrated embodiments of FIGS. 7B-7D.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a nanowire field effect transistor (FET) device, the method comprising:
    forming a nanowire over a semiconductor substrate;
    forming a gate structure around a portion of the nanowire;
    forming a capping layer on the gate structure;
    forming a first spacer adjacent to sidewalls of the gate and around portions of nanowire extending from the gate;
    forming a hardmask layer on the capping layer and the first spacer;
    removing exposed portions of the nanowire;
    epitaxially growing a doped semiconductor material on exposed cross sections of the nanowire to form a source region and a drain region;
    forming a silicide material in the epitaxially grown doped semiconductor material;
    forming a conductive material on the source and drain regions by:
        depositing a first layer of conductive material on the substrate, the source and drain regions, and the hardmask layer;
        removing a portion of the first layer of conductive material and the hardmask layer;
        depositing a second layer of conductive material on the first layer of conductive material and the capping layer;
        patterning a protective mask material on the second layer of conductive material; and
        etching to define a contact in the source region, a contact in the drain region, and a contact in a gate region; and
    forming an isolation region around the device.

2. The method of claim 1, wherein the method further includes forming a silicide material in the capping layer after removing the portion of the first layer of conductive material and the hardmask layer.

3. The method of claim 1, wherein the method further includes forming a second spacer adjacent to sidewalls of the first spacer, sidewalls of the hardmask layer, and around portions of nanowire extending from the gate after forming the hardmask layer on the capping layer and the first spacer.

4. The method of claim 1, wherein the epitaxially grown doped semiconductor material is an n-type doped material.

5. The method of claim 1, wherein the epitaxially grown doped semiconductor material is a p-type doped material.

6. The method of claim 1, wherein the epitaxially grown doped semiconductor material is silicon.

7. The method of claim 1, wherein the epitaxially grown doped semiconductor material is a SiGe alloy.

8. The method of claim 1, wherein the gate structure includes a silicon oxide layer disposed on the gate portion of the nanowire, a dielectric layer disposed on the silicon oxide layer, and a metal layer disposed on the dielectric layer.

9. The method of claim 1, wherein the gate structure is formed in circumferential layers surrounding the gate portion of the nanowire.

10. The method of claim 1, wherein the first spacer includes a nitride material.

11. The method of claim 1, wherein the epitaxially grown doped semiconductor material is an in-situ doped material.

12. The method of claim 1, wherein the epitaxially grown doped semiconductor material is uniformly doped.

13. A method for forming a nanowire field effect transistor (FET) device, the method comprising:
    forming a nanowire over a semiconductor substrate;
    forming a gate structure around a portion of the nanowire;
    forming a capping layer on the gate structure;
    forming a first spacer adjacent to sidewalls of the gate and around portions of nanowire extending from the gate;
    forming a hardmask layer on the capping layer and the first spacer;
    removing exposed portions of the nanowire;
    doping the exposed portions of the nanowire to form source and drain regions;
    forming a silicide material in the source and drain regions of the exposed portions of the nanowire;
    forming a conductive material on the source and drain regions by:
        removing the hardmask layer;
        forming a silicide material in the capping layer;
        depositing a first layer of conductive material on the substrate, the source and drain regions, and the silicide material in the capping layer;
        removing a portion of the first layer of conductive material to expose the silicide material in the capping layer;
        depositing a second layer of conductive material on the first layer of conductive material and the silicide material in the capping layer;
        patterning a protective mask material on the second layer of conductive material; and
        etching to define a contact in the source region, a contact in the drain region, and a contact in a gate region; and
    forming an isolation region around the device.

14. The method of claim 13, wherein the method further includes forming a silicide material in the capping layer after removing the portion of the first layer of conductive material and the hardmask layer.

15. The method of claim 13, wherein the method further includes forming a second spacer adjacent to sidewalls of the first spacer, sidewalls of the hardmask layer, and around portions of nanowire extending from the gate after forming the hardmask layer on the capping layer and the first spacer.

16. A nanowire field effect transistor (FET) device including:
    a channel region including a silicon portion having a first distal end extending from the channel region and a second distal end extending from the channel region, the silicon portion is partially surrounded by a gate structure disposed circumferentially around the silicon portion;
    a polysilicon capping layer disposed on a substrate, the polysilicon capping layer having a silicide portion disposed on the gate structure;
    a source region having a silicide portion, the source region including a first doped epi-silicon nanowire extension contacting the first distal end of the silicon portion;

a drain region having a silicide portion, the drain region including a second doped epi-silicon nanowire extension contacting the second distal end of the silicon portion;
a first conductive member contacting the silicide portion of the polysilicon capping layer and the substrate;

a second conductive member contacting the silicide portion of the source region; and
a third conductive member contacting the silicide portion of the drain region.

* * * * *